(12) United States Patent
Oishi et al.

(10) Patent No.: US 8,460,522 B2
(45) Date of Patent: Jun. 11, 2013

(54) METHOD OF FORMING THIN FILM AND APPARATUS FOR FORMING THIN FILM

(75) Inventors: Yuichi Oishi, Chiba (JP); Takashi Komatsu, Chiba (JP); Junya Kiyota, Chiba (JP); Makoto Arai, Chiba (JP)

(73) Assignee: ULVAC, Inc., Kanagawa (JP)

( * ) Notice: Subject to any disclaimer, the term of this patent is extended or adjusted under 35 U.S.C. 154(b) by 1055 days.

(21) Appl. No.: 12/446,888

(22) PCT Filed: Oct. 12, 2007

(86) PCT No.: PCT/JP2007/069921
§ 371 (c)(1),
(2), (4) Date: May 22, 2009

(87) PCT Pub. No.: WO2008/050618
PCT Pub. Date: May 2, 2008

(65) Prior Publication Data
US 2010/0155225 A1  Jun. 24, 2010

(30) Foreign Application Priority Data

Oct. 24, 2006  (JP) ................................ 2006 288494
Mar. 7, 2007  (JP) ................................ 2007 057404

(51) Int. Cl.
*C23C 14/35*  (2006.01)
(52) U.S. Cl.
USPC ............. 204/298.2; 204/298.25; 204/298.26; 204/192.13; 204/192.12; 204/298.16
(58) Field of Classification Search
USPC ............. 204/298.25, 298.26, 192.12, 192.13, 204/298.16, 298.2
See application file for complete search history.

(56) References Cited

U.S. PATENT DOCUMENTS

| | | | |
|---|---|---|---|
| 5,229,194 A | * | 7/1993 | Lingle et al. .................. 428/216 |
| 2004/0231973 A1 | * | 11/2004 | Sato et al. ................ 204/192.12 |
| 2007/0068794 A1 | * | 3/2007 | Lippey et al. .............. 204/192.1 |

FOREIGN PATENT DOCUMENTS

| JP | 4-063267 | 2/1992 |
|---|---|---|
| JP | 2000192239 | 7/2000 |
| JP | 2004346388 | 12/2004 |
| JP | 2005290550 | 10/2005 |

OTHER PUBLICATIONS

International Search Report for PCT Patent App. No. PCT/JP2007/069921 (Jan. 8, 2008).

* cited by examiner

*Primary Examiner* — Keith Hendricks
*Assistant Examiner* — Jason M Berman
(74) *Attorney, Agent, or Firm* — Cermak Nakajima LLP; Tomoko Nakajima

(57) ABSTRACT

A plurality of targets are disposed in parallel with, and at a given distance to, one another. In case a predetermined thin film is formed by sputtering, the occurrence of non-uniformity in the film thickness distribution and the film quality distribution can be restricted. During the time when electric power is charged to a plurality of targets (31a to 31h) which are disposed inside a sputtering chamber (11a) so as to lie opposite to the process substrate (S), and are disposed at a predetermined distance from, and in parallel with, one another, thereby forming a predetermined thin film by sputtering, each of the targets is reciprocated at a constant speed in parallel with the process substrate. Also, magnet assemblies that form tunnel-shaped magnetic flux (M) in front of each target are reciprocated at a constant speed in parallel with each of the targets. When each of the targets has reached a turning position of the reciprocating movement, the reciprocating movement of each of the targets is stopped for a predetermined period of time.

11 Claims, 6 Drawing Sheets

METHOD OF FORMING THIN FILM AND APPARATUS FOR FORMING THIN FILM

This application is a U.S. national phase filing under 35 U.S.C. §371 of PCT Application No. PCT/JP2007/069921, filed Oct. 12, 2007, and claims priority thereto under 35 U.S.C. §119 to Japanese patent application No. 2006-288494, filed Oct. 24, 2006 and Japanese patent application No. 2007-057404, filed Mar. 7, 2007, the entireties of both of which are incorporated by reference herein.

FIELD OF THE INVENTION

The present invention relates to a method of, and an apparatus for, forming a thin film on a surface of a processing substrate such as glass by a sputtering method.

BACKGROUND ART

As a method of forming a thin film in which a predetermined thin film is formed on a surface of a process substrate such as glass, there is a sputtering method. Particularly in the sputtering method of magnetron system, by arresting electrons generated by ionization in front of a target and secondary electrons generated by sputtering, the electron density in front of the target is enhanced and the probability of collision of these electrons with gas molecules of an inert gas to be introduced into a vacuum chamber is enhanced to thereby increase the plasma density. Therefore, this method has an advantage in that the film forming speed can be improved and the like and is often utilized in forming a predetermined thin film on a surface of a process substrate. Recently, this method is quite often utilized in forming a predetermined thin film on a substrate that is large in area such as a glass substrate for manufacturing a flat display panel (FDP).

As an apparatus for efficiently forming a predetermined thin film at a constant film thickness on a process substrate having a large area, there is known a sputtering apparatus in which a plurality of targets of the same shape are disposed inside a vacuum chamber in parallel with one another. In this sputtering apparatus, however, the sputtered particles are not emitted from the region between the respective adjoining targets. Therefore, if a predetermined thin film is formed on the surface of the process substrate, the film thickness distribution of this thin film and the film quality distribution at the time of reactive sputtering become non-uniform in an undulated manner (e.g., in the film thickness distribution, a thicker part and a thinner part are repeated in the same cycle).

As a solution, it has been proposed to improve the non-uniformity in the above-described film thickness distribution and the film quality distribution by: integrally reciprocating each of the targets in parallel with the process substrate at a constant speed while electric power is supplied to each of the targets to form the thin film by sputtering; and thus changing the regions in which the sputtered particles are not emitted, as a result of integrally moving each of the targets, in other words, by causing the entire surface of the process substrate to lie opposite to the region in which the sputtered particles are emitted from the surfaces of the targets. In addition, in order to further enhance the uniformity in the film thickness distribution and the film quality distribution, it has also been proposed to reciprocally move a magnet assembly disposed to form a magnetic flux of tunnel shape in front of each of the targets, in parallel with the target and at a constant speed, thereby changing the position of the tunnel-shaped magnetic flux in which sputtering rate becomes high (patent document 1).

Patent Document 1: JP-A-2004-346388 (see, e.g., what is described in claims).

DISCLOSURE OF THE INVENTION

Problems to be Solved by the Invention

However, since the splashing distribution of the sputtered particles at the time of sputtering varies with the target species such as Al, Ti, Mo and ITO, there was consequently a problem in that there still remains minute non-uniformity in the film thickness distribution and the film quality distribution in the thin film that was formed on the surface of the process substrate. If there is this kind of non-uniformity in the film thickness distribution and the film quality distribution, there is a disadvantage in that irregularities may occur on the display surface when a FPD panel is manufactured by forming a clear electrode (ITO) on a glass substrate and then by filling liquid crystal.

As a solution, it may be considered to adjust the speed and distance of the reciprocating movement of the target and magnet assembly depending on the target species to thereby restrict the occurrence of minute non-uniformity in the film thickness distribution and the film quality distribution. However, since not only the magnet assembly but also each of the targets are continuously moved in a reciprocating manner at a constant speed, there is only a small degree of freedom in the control and, therefore, it was difficult to restrict the occurrence of non-uniformity in the film thickness distribution and the film quality distribution.

Therefore, in view of the above-described points, it is a problem of the invention to provide a method of, and apparatus for, forming a thin film in which, at the time of forming a predetermined thin film by sputtering, the occurrence of film thickness distribution and the film quality distribution in the thin film to be formed on the surface of the process substrate can be restricted at a high degree of freedom depending on the target species in the sputtering chamber.

Means for Solving the Problems

In order to solve the above-described problems, the method as described in claim 1 is a method of forming thin film in which electric power is charged to a plurality of targets disposed in a sputtering chamber in opposite positional relationship with a process substrate, the targets being disposed in parallel with, and at a predetermined distance to, one another, characterized in: that each of the targets is reciprocated at a constant speed in parallel with the process substrate; that each of magnet assemblies which respectively forms a tunnel-shaped magnetic flux in front of each of the targets is reciprocated at a constant speed in parallel with each of the targets; and that, when each of the targets has reached a return point of the reciprocating movement, the reciprocating movement of each of the targets is stopped for a predetermined period of time.

According to the above, when a predetermined thin film is formed by sputtering, each of the targets is moved in parallel with the process substrate and, when each of the targets has reached one of the return points of reciprocating movement, the movement of each of the targets is stopped once. In a state in which the targets are stopped, the magnet assemblies behind the targets are reciprocated at a constant speed to thereby continuously change the position of the tunnel-shaped magnetic flux at which the sputtering rate becomes high. Then, after the lapse of a predetermined period of time, while the reciprocating movement of the magnet assemblies is kept as it is, each of the targets is resumed in movement, thereby moving each of the targets toward the other of the return points. Once each of the targets has reached the other of the return points, the movement of each of the targets is stopped again.

When the thin film is formed in this manner, only by appropriately setting the stopping time of the targets at each of the return points, while considering the sputtering time and the speed of the reciprocating movement of the magnet assemblies, the amount of sputtered particles toward the process substrate can be adjusted depending on the target species, i.e., splash distribution at the time of sputtering of each of the targets. As a result, the freedom in the control of the film thickness and the film quality becomes high and the occurrence of minute non-uniformity in the film thickness distribution and the film quality distribution in the thin film formed on the surface of the process substrate can be restricted.

During the sputtering, preferably, the charging of electric power to the targets is performed only while each of the targets is stopped in the reciprocating movement. In this manner, the freedom in controlling the film thickness and the film quality can be further improved.

On the other hand, it is preferable that, while the reciprocating movement of each of the targets is stopped for a predetermined period of time, the magnet assemblies are moved to make at least one reciprocating movement.

In order to solve the above-described problems, the method of forming a thin film according to claim 4, in which a process substrate is transported, among sputtering chambers in which an equal number of targets are respectively disposed at an equal distance from, and in parallel with, one another, to a position lying opposite to each of the targets, and laminate an equal or different thin film on the surface of the process substrate by sputtering is characterized in that the position of each of the targets in each of the sputtering chambers is deviated mutually and integrally in a direction of transporting the process substrate relative to the process substrate.

According to this configuration, in one sputtering chamber the process substrate is moved to a position lying opposite to each of the targets disposed in parallel with one another at an equal distance. Electric power is charged to each of the targets to thereby form by sputtering one thin film on the surface of the process substrate. In this state, since sputtered particles are not emitted from the regions between respective targets, the above-described one thin film is not uniform as a result of repetition of the thick-film parts and the thin-film parts in the same cycle. Thereafter, the process substrate on which is formed the one thin film is transported to the other sputtering chamber. Electric power is charged in the other sputtering chamber to thereby form another thin film by sputtering.

In the other sputtering chamber, the position of each of the targets that have been disposed in parallel with one another at the same distance as in the one sputtering chamber relative to the process substrate is integrally deviated in the direction of transporting the substrate. In other words, the deviation has been made such that, among the process substrate on which, e.g., one thin film has been formed, the thicker-film portions are laid opposite to the region between the targets and that the thinner-film portions are laid opposite to the sputtering surfaces of the targets. Therefore, when the other thin films are laminated with substantially the same film thicknesses, the thicker-film portion and the thinner-film portion will be reversed when the other thin film is laminated substantially in the same film thickness. The overall film thickness of the laminated films can thus be made substantially uniform over the entire process substrate. In this case, depending on the target species to be disposed in each of the sputtering chambers, the non-uniformity in the film thickness distribution on the surface of the process substrate and the film quality distribution at the time of reactive sputtering can be easily kept under control.

If AC voltage is charged to respective pairs of targets out of the parallelly disposed targets by alternately changing polarity at a predetermined frequency, and each of the targets is switched to an anode electrode and a cathode electrode so that plasma atmosphere is formed between the anode electrode and the cathode electrode by generating glow discharge, whereby each of the targets is sputtered, the electric charges accumulated on the surfaces of the targets are cancelled by charging the opposite phase voltage, more stable discharge can be obtained.

In order to solve the above-described problems, the sputtering apparatus of claim 6 comprises: a plurality of targets disposed in a process chamber in opposite positional relationship with a process substrate, the targets being disposed in parallel with, and at a predetermined distance to, one another; a sputtering power source that enables electric charge to each of the targets; magnet assemblies that respectively form magnetic fluxes in front of the targets; a first driving means that reciprocates each of the targets at a constant speed in the direction in which each of the targets is disposed in parallel with one another; a second driving means that reciprocates the magnet assemblies in parallel with the target; and a stopping means that stops the reciprocating movement of each of the targets for a predetermined period of time when the targets have reached a return point of the reciprocating movement.

The sputtering electric power source is an AC power source that charges voltage to respective pairs to be formed by the plurality of targets at a predetermined frequency by alternately changing polarity. Each of the targets is alternately switched between anode electrode and cathode electrode to cause the glow discharge to be generated between the anode electrode and the cathode electrode, thereby forming a plasma atmosphere. If sputtering is made of each of the targets, there is no need of providing constituting parts such as anode and shield in the region (space) between each of the targets. Therefore, the region in which sputtered particles are not emitted can be minimized to the extent possible and, as a result, the distance of reciprocating movements of the targets and magnet assemblies can be minimized and the vacuum chamber may also be small.

Effect of the Invention

As described hereinabove, the sputtering apparatus and the sputtering method of the invention has an effect in that the occurrence of non-uniform film thickness distribution and the film quality distribution can be kept under control at a high degree of freedom depending on the target species.

BEST MODE FOR CARRYING OUT THE INVENTION

With reference to FIGS. 1 and 2, reference numeral 1 denotes a sputtering apparatus in magnetron system according to the invention. The sputtering apparatus 1 is of an inline type and has a vacuum chamber 11 that can be maintained at a predetermined degree of vacuum through an evacuating means such as a rotary pump, a turbo-pump, and the like (not illustrated), and constitutes a sputtering chamber 11a. On an upper part of the vacuum chamber 11 there is provided a substrate transporting means 2. This substrate transporting means 2 has a known construction. For example, it has a carrier 21 on which a process substrate S is mounted. By intermittently driving a driving means (not illustrated), the process substrate S can be sequentially transported to a position lying opposite to targets which are described hereinafter. In a lower part in the vacuum chamber 11 there is disposed a cathode electrode C.

The cathode electrode C has eight (8) targets 31a to 31h which are disposed in a manner to lie opposite to the process substrate S. Each of the targets 31a to 31h is manufactured in a known method depending on the thin film composition such as Al, Ti, Mo, ITO and the like to be formed on the surface of the process substrate S, and is formed into the same shape of, e.g., substantially rectangular parallelepiped (rectangular as seen in plan view). Each of the targets 31a to 31h is bonded through a bonding material such as indium, tin and the like, to a backing plate 32 which cools the targets 31a to 31h during sputtering. Each of the targets 31a to 31h is disposed side by side at an equal distance to one another such that the sputtering surface (surface to be sputtered) 311 when not used yet is positioned on the same plane that is parallel with the process substrate S, and is attached, on the rear surface side of the backing plate 32 (the side opposite to the sputtering surface 311; on the lower side in FIG. 1), to a supporting plate 33 which is elongated in the direction of arranging each of the targets 31a to 31h.

On the supporting plate 33 there is provided a shield plate 34 so as to enclose the circumference of the targets 31a to 31h. The shield plate 34 serves the function of an anode at the time of sputtering, and also prevents, at the time of generating plasma in front of the sputtering surface 311 of the targets 31a to 31h, the plasma from diffracting to the rear side of the targets 31a to 31h. Each of the targets 31a to 31h is respectively connected to a DC power source (sputtering power source) 35 provided outside the vacuum chamber 11 so that a predetermined value of DC voltage can be independently charged to each of the targets 31a to 31h.

Further, the cathode electrode C has a magnet assembly 4 which is positioned respectively on the rear surface side of the targets 31a to 31h. Each of the magnet assemblies 4 having the same construction has a supporting plate 41 which is provided in parallel with each of the targets 31a to 31h. In case the targets 31a to 31h are rectangular as seen from the front, the supporting plate 41 is constituted by a flat rectangular plate formed such that it is smaller than the width of each of the targets 31a to 31h and that it is elongated in both sides along the longitudinal direction of the targets 31a to 31h. The supporting plate 41 is made of a magnetic material that amplifies the attracting force of the magnet. On the supporting plate 41 there are provided central magnet 42 and peripheral magnet 43 with changed polarity on the side of the sputtering surface 311, the central magnet 42 being disposed in a bar shape along the longitudinal direction in its central portion, and the peripheral magnet being disposed along the outer periphery of the supporting plate 41 in a manner to enclose the circumference of the central magnet 42.

The volume of the central magnet 42 when converted to equivalent magnetization intensity is designed to be equal to the sum of the volume as converted to the equivalent magnetization intensity, e.g., of the peripheral magnet 43 (peripheral magnet: central magnet: peripheral magnet=1:2:1). In front of the sputtering surface 311 of each of the targets 31a to 31h, there will thus be respectively formed a balanced tunnel-like magnetic flux M (see FIG. 2). By thus capturing electrons ionized in front of each of the targets 31a to 31h and secondary electrons generated by sputtering, the electron density in front of each of the targets 31a t 31h can be enhanced and the plasma density increases, thereby making the sputtering rate high.

In addition, the vacuum chamber 11 is provided with a gas introducing means 5 that introduces a sputtering gas including an inert gas such as Ar and the like. The gas introducing means 5 has a gas tube 51 one end of which is mounted on a side wall, e.g., of the vacuum chamber 11. The other end of the gas pipe 51 is communicated with a gas source 53 through a massflow controller 52. In case a predetermined thin film is formed on the surface of the process substrate S by reactive sputtering, another gas introducing means is provided that introduces a reactant gas such as oxygen and nitrogen and the like into the sputtering chamber 11a.

The carrier 21 on which the process substrate S has been set in position is transported by the substrate transporting means 2 to a position lying opposite to the parallelly disposed targets 31a to 31h. A sputtering gas (or a reactant gas) is introduced at a predetermined pressure (e.g., $10^{-5}$ Pa) through the gas introducing means 5, and negative DC voltage is applied to the targets 31a to 31h through the DC power source 35. Then, an electric field vertical to the process substrate S and the targets 31a to 31h is formed and plasma is generated in front of the targets 31a to 31h. Then, the ions in the plasma atmosphere are accelerated toward each of the targets 31a to 31h and collided thereto. The sputtered particles (target atoms) are splashed toward the process substrate S to thereby form a thin film on the surface of the process substrate S.

In the above-described sputtering apparatus 1, sputtered particles will not be emitted from the regions R1 between the respective adjoining targets 31a to 31h. If a predetermined thin film is formed on the surface of the process substrate S in this state, the film thickness distribution and the film quality distribution at the time of reactive sputtering will become ruffled, i.e., become non-uniform such that a thick-film part and a thin-film part are repeated in the same cycle. In this case, the above-described non-uniformity may be improved to a certain degree by appropriately adjusting the distance between the process substrate S and a kind of targets 31a to 31h to be used in the above-described sputtering apparatus 1, or the distance between the respective adjoining targets 31a to 31h. However, when other kinds of targets 31a to 31h are used, there are cases where the above-described non-uniformity will remarkably appear because the splashing distribution of the sputtered particles at the time of sputtering will vary with target species.

Taking the above circumstances into consideration, it has been decided to employ the following configuration of the sputtering apparatus 1. In other words, on one side of the supporting plate 33 that supports the targets 31a to 31h, there is connected a driving shaft 61 of a first driving means 6 which is, e.g., a servomotor having a known construction. During sputtering operation, the supporting plate 33 is integrally reciprocated in parallel with the process substrate S and at an even speed between two points (A, B) that lie in the direction in which the targets 31a to 31h are parallelly disposed. In addition, each of the magnet assemblies 4 is respectively connected to a driving shaft 71 of a second driving means 7 which is constituted by a motor, air cylinder and the like. The magnet assemblies 4 are thus integrally reciprocated in parallel with the process substrate S and at an even speed between two points that lie in the direction in which the targets 31a to 31h are parallelly disposed.

In this case, the distance of travel D1 of the targets 31a to 31h shall be set such that: when each of the targets 31a to 31h is moved to one B of the return points (the point shown in dotted lines in FIG. 2), part of the sputtering surfaces 311 of the targets 31a to 31h lie in the region R1 in which the sputtered particles are not emitted in the other A of the return points (the point shown in solid lines in FIG. 2) so as to lie opposite to the process substrate S; and that the volume of the vacuum chamber 11 does not increase. On the other hand, the distance of the magnet assemblies 4 shall be set such that, when the magnet assemblies 4 are reciprocated, tunnel-shaped magnetic fluxes are always positioned above the sputtering surface 311 of each of the targets 31a to 31h.

According to the above configuration, by integrally moving each of the targets 31a to 31h to thereby vary the regions in which the sputtered particles are not emitted, i.e., by causing the entire surface of the process substrate to lie opposite to the region in which the sputtered particles are emitted in the surface of each of the targets 31a to 31h, the film thickness distribution and the film quality distribution can be improved depending on the target species. However, despite the continuous and constant-speed reciprocating movement of each of the targets 31a to 31h and the magnet assemblies 4, there are still cases in which minute non-uniform film thickness distribution and film quality distribution remain due to the difference, depending on the target species, in the splashing distribution of the sputtered particles at the time of sputtering operation.

As a solution, it may be considered to keep under control the occurrence of minute non-uniform film thickness distribution and film quality distribution by adjusting the speed and the moving distance of the targets 31a to 31h and the magnet assemblies 4 depending on the target species. However, since each of the targets 31a to 31h in addition to the magnet assemblies 4 are subjected to continuous and constant-speed reciprocating movement, the freedom in their control is low and the control in restricting the occurrence of non-uniform film thickness distribution and film quality distribution is difficult.

In an embodiment of the invention, the driving shaft 61 as the first driving means 6 has mounted thereto a stopping means (not illustrated) in the form, e.g., of an electromagnetic brake having a known construction. While a predetermined thin film is being formed in sputtering by supplying electric power through DC power source 35 to each of the targets 31a to 31h, each of the targets 31a to 31h is moved in parallel with the process substrate S in the direction in which the targets are disposed in parallel with one another. When each of the targets 31a to 31h has reached one A of the return points, the stopping means is actuated to thereby temporarily stop the movement of each of the targets 31a to 31h. In a state in which each of the targets 31a to 31h is stopped, the magnet assemblies 4 are reciprocated at a constant speed by the second driving means 7, whereby the positions of the tunnel-shaped magnetic fluxes in which the sputtering rate becomes high are continuously varied. Then, after a lapse of a predetermined time, while the reciprocating movement of the magnet assemblies 4 is maintained, the movement of each of the targets 31a to 31h by the first driving means 6 is resumed to thereby move the targets toward the other B of the return points. When each of the targets 31a to 31h has reached the other return point B, the stopping means is actuated again, while maintaining the reciprocating movement of the magnet assemblies 4, and the movement of each of the targets 31a to 31h is stopped once again.

According to this configuration, taking into consideration the sputtering time and the speed of reciprocating movement of the magnet assemblies 4, the time of stopping of the targets 31a to 31h at the respective return points A, B can be appropriately set. As a result of this operation alone, the amount of sputtered particles toward the process substrate S can be adjusted depending on the splashing distribution at the time of sputtering of the target species, i.e., each of the targets. Consequently, the freedom in the control of the film thickness and the film quality increases, whereby the occurrence of non-uniformity in the film thickness distribution and the film quality distribution in the film formed on the surface of the process substrate S can be kept under control. In this case, while the operation of the first driving means 6 is stopped to thereby stop each of the targets 31a to 31h for a predetermined period of time, the magnet assemblies 4 may be reciprocated at least once. In addition, in order to further improve the freedom in the control of the film thickness and the film quality, the operation of the sputtering power source 35 may be controlled so that the power supply to the targets 31a to 31h is made only during the stopping of the reciprocating movement of each of the targets 31a to 31h.

The time of stopping of the targets 31a to 31h at each of the return points A, B is not particularly limited if the magnet assemblies 4 make at least one round trip at each of the return points A, B. However, in case a motor is used as the first driving means 6 and the reciprocating movement of the targets 31a to 31h is stopped by the stopping means, the load on the first driving means 6 must be taken into consideration. In this case, it is preferable to set the time of stopping at a time below 50% of the sputtering time. Further, considering the overall sputtering time, the time of stopping is set such that the targets 31a to 31h stop for the same period of time at each of the return points A, B.

In forming a thin film on the process substrate S, first, in a state in which the targets 31a to 31h are stopped in one of the return points A, B, negative DC voltage is applied through DC power source 35 to thereby start the sputtering (in this stopping state of the targets 31a to 31h the magnet assemblies 4 are reciprocated). The reciprocating movements of the targets 31a to 31h and the magnet assemblies 4 may be so controlled that, after the lapse of a predetermined time, the targets 31a to 31h are moved to the other of the return points A, B. On the other hand, the reciprocating movements of the targets 31a to 31h and the magnet assemblies 4 may also be controlled such that, at the time of starting the sputtering, the targets 31a to 31h are moved from one of the return points A, B to the other thereof and, after having reached the other of the return points A, B, they stop there for a predetermined period of time.

In this embodiment, DC power source is used as the sputtering power source. Without being limited thereto, the following configuration may also be employed. In other words, out of each of the targets 31a to 31h that are disposed in parallel with each other, two are arranged to make respective pairs. An output cable from an AC power source is connected to respective pairs of targets 31a to 31h. Voltage is then applied to respective pairs of targets 31a to 31h by alternately changing the polarity at a predetermined frequency (1~400 KHz). According to this configuration, each of the targets 31a to 31h is alternately switched to anode electrode and cathode electrode to thereby cause glow discharge to occur between the anode electrode and the cathode electrode, thereby forming a plasma atmosphere. Ions in the plasma atmosphere are accelerated to, and collide with, one of the targets 31a to 31h that has become the cathode electrode. Target electrons are thus splashed to thereby adhere to, and deposit on, the surface of the process substrate S to form a predetermined thin film. In this case, since there is no need of providing such constituting parts as shield in the region R1 between the respective adjoining targets 31a to 31h, the region in which the sputtered particles are not emitted can be minimized to the extent possible. As a result, the distance of the reciprocating movements of the targets 31a to 31h and the magnet assemblies 4 can be minimized, and the vacuum chamber 11 can also be minimized.

Further, in case a predetermined thin film is formed on the surface of the process substrate S by reactive sputtering, if the reactant gas is introduced into the vacuum chamber 11 in an ill-balanced manner, there will be generated in-plane non-uniformity in reactivity in the process substrate S. As a solution, on the rear side of each of the magnet assemblies 4 that are disposed in parallel with each other, at least a gas pipe is provided in a manner to be elongated in the direction in which the targets 31a to 31h are disposed. One end of this gas pipe is connected to a gas source of a reactant gas such as oxygen and the like through a massflow controller, thereby constituting a gas introducing means for the reactant gas.

Then, on the target side of the gas pipe, a plurality of exhaust nozzles of the same diameter are disposed at a predetermined distance from one another. A reactant gas is ejected out of the ejection nozzles formed in the gas pipe so that the reactant gas is once dispersed in the space on the rear surface side of each of the targets 31a to 31h. Then, the reactant gas is supplied to the process substrate S through each clearance between adjoining targets 31a to 31h that are disposed in parallel with one another.

With reference to FIGS. 4 and 5, reference numeral 10 denotes a sputtering apparatus of magnetron system relating to another embodiment. This sputtering apparatus 10 is also of an inline type and has a vacuum chamber 110 that can be maintained in a predetermined degree of vacuum through an exhaust means (not illustrated) such as a rotary pump, a turbo pump, and the like. In the central portion of the vacuum chamber 110, there is provided a partition plate 120. By this partition plate 120 are defined two sputtering chambers 110a, 110b of substantially the same volume and isolated from each other. On an upper part of the vacuum chamber 110 there is provided a substrate transporting means 2 which is similar to the one as in the above-described embodiment. Each of the sputtering chambers 110a, 110b is respectively provided with a mask plate 130 located between the substrate transporting means 2 and the targets 31a to 31h.

Each of the mask plates 130 has formed therein openings 130a, 130b to which the process substrate S faces. Each mask plate 130 is mounted in such a manner that the layout of the openings 130a, 130b in each of the sputtering chambers 110a, 110b substantially coincides with each other. The mask plates 130 thus serve to prevent the sputtered particles from getting adhered to the surface of the carrier 21 and the like when a predetermined thin film is formed by sputtering. The constitution of other parts in the sputtering chambers 110a, 110b is the same as that in the above embodiment. On the lower side of each of the sputtering chambers 110a, 110b there is disposed a cathode electrode C of the same construction.

Then, the carrier 21 on which the process substrate S has been set in position is transported by the substrate transporting means 2 to one of the sputtering chamber 110a at a position which lies opposite to the targets 31a to 31h (at this time the process substrate S and the opening 130a of the mask plate 130 are positioned relative to each other in the vertical direction). Then, the sputtering gas (or a reactant gas) is introduced through the gas introduction means 5a at a predetermined pressure, and negative DC voltage is applied to the targets 31a to 31h through the DC power source 35. An electric field vertical to the process substrate S and the targets 31a to 31h is thereby formed, and plasma atmosphere is formed in front of the targets 31a to 31h.

Then, ions in the plasma atmosphere are accelerated toward each of the targets 31a to 31h and are collided thereto, and the sputtered particles (target atoms) are splashed toward the process substrate S, whereby a thin film is formed on the surface of the process substrate S. Thereafter, the process substrate S on which one thin film has been formed is transported to the other sputtering chamber 110b. In the same manner as in the above, in a state in which the sputtering gas (or a reactant gas) is introduced through the gas introduction means 5b, negative DC voltage is applied to the targets 31a to 31h through the DC power source 35. There is thus laminated another thin film which is the same as, or different from, the above-described one thin film that has already been formed on the surface of the process substrate S by sputtering.

When another thin film is formed in the other sputtering chamber 110b, the position of the targets 31a to 31h relative to the process substrate S is integrally deviated in the direction of transporting the substrate by the first driving means 6a from the position of the targets 31a to 31h at the time when the above-described one thin film was formed in the one sputtering chamber 110a (see FIG. 5).

In other words, in a state in which the above-described one thin film was formed in the one sputtering chamber 110a, the sputtered particles are not emitted from the region between respective pairs of the targets 31a to 31h. Therefore, the above-described one thin film is not uniform such that the thicker-film portion and the thinner-film portion are repeated in the same cycle. In the other sputtering chamber 110b the thicker-film portion in the process substrate S on which the above-described one thin film has been formed is caused to lie opposite to the region between the targets, and the thinner-film portion is caused to lie opposite to the sputtering surface of the targets. In this manner, the thicker-film portion and the thinner-film portion will be reversed when the other thin film is formed by laminating substantially in the same film thickness. The overall film thickness of the laminated film can therefore be made substantially the same over the entire surface of the process substrate.

As a result, even in case the splash distribution of the sputtered particles may vary depending on the kind of the targets 31a to 31h to be disposed in each of the sputtering chambers 110a, 110b, the non-uniformity in the film thickness distribution on the surface of the process substrate and the film quality distribution at the time of reactive sputtering can be easily kept under control only by appropriately setting the position of each of the targets 31a to 31h in the other sputtering chamber 110b.

In case each of the targets 31a to 31h is integrally deviated between the one sputtering chamber 110a and the other sputtering chamber 110b, the center line in the direction of transportation of the targets 31a to 31h that are disposed in parallel with one another at an equal distance is made to coincide with the center line which is at right angles to the direction of transportation, e.g., of the mask plate 130. Then, based on the distance A between the respective center lines of each of the targets, a deviation is made by A/4 to the upper stream side of direction of transportation (to the left in FIG. 5) in the one sputtering chamber 110a. In the other sputtering chamber 110b, on the other hand, a deviation may be made by A/4 in the lower stream side of direction of transportation (to the right side in FIG. 5). The amount of movement of the targets in each of the sputtering chambers 110a, 110b may be appropriately selected depending on the target species to be used and the atmosphere during sputtering in both the sputtering chambers 110a, 110b.

EXAMPLE 1

In the Example 1, by using the sputtering apparatus as shown in FIG. 1, Al film was formed on the process substrate by sputtering. As the targets 31a to 31h, there were used ones whose composition is 99% Al. They were formed into substantially rectangle as seen in plan view of 200 mm×2300 mm×16 mm thick, were bonded to the backing plate 32, and were disposed on the supporting plate 33 at a distance of 270 mm. The supporting plates 41 of the magnet assemblies 4 had external dimensions of 130 mm×2300 mm, and were disposed at a distance of 270 mm.

On the other hand, as the process substrate, glass substrates having external dimensions of 1500 mm ×1850 mm were used. As the sputtering conditions, the distance between the process substrate S and each of the targets 31a to 31h was set to 160 mm. The massflow controller was controlled so as to maintain the pressure inside the evacuated sputtering chamber 11 to 0.5 Pa, and Ar was introduced into the vacuum chamber 11. The temperature of the process substrate S was set to 120° C., the charged electric power was set to 30 kW, and the sputtering time was set to 50 seconds. Each of the targets 31a to 31h was set to 135 mm in the distance of movement D1, was reciprocated at a speed of 13 mm/sec, and was stopped by the stopping means at the return points A, B for a predetermined period of time (set to 10 and 20 seconds in this example). On the other hand, the magnet assemblies 4 were set to 55 mm in the distance of movement D1, and were continuously reciprocated during sputtering at a speed of 12 mm/sec.

FIG. 3 is a graph showing the film quality distribution together with the film thickness distribution of the process substrate in the direction in which the targets were disposed in parallel with one another when Al films were formed under the above-described conditions, wherein sputtering was made by fixing the center of the targets to the intermediate point of the reciprocal movement of the targets 31a to 31h (Comparative Example 1) and sputtering was made by continuously reciprocating the targets 31a to 31h (Comparative Example 2).

According to the above, in the Comparative Example 1 as shown by the dotted line in FIG. 3, the sheet resistance value showing the film quality repeated large undulations in the same cycle, and its distribution was±10.2%. In the Comparative Example 2 as shown by the two-dot chain line in FIG. 3, the undulating non-uniformity in the sheet resistance was slightly improved as a result of reciprocating the targets 31a to 31h at an equal speed, but its film thickness distribution was ±7.0%. On the other hand, as shown by the solid line (stop time of 20 seconds) and by the dash dot line (stop time of 10 seconds) in FIG. 3, the undulating non-uniformity in the sheet resistance was largely improved as a result of stopping the targets in Example 1, and the distribution was ±4.0% when the stopping time was set to 20 seconds.

EXAMPLE 2

In the Example 2, by using the sputtering apparatus 10 as shown in FIG. 4, Al film was formed on the process substrate by sputtering. As the targets 31a to 31h disposed in each of the sputtering chambers 110a, 110b, there were used ones whose composition is 99% Al. They were formed into substantially rectangle as seen in plan view of 200 mm×2300 mm×16 mm thick, were bonded to the backing plate 32, and were disposed on the supporting plate 33 at a distance of 270 mm. The supporting plates 41 of the magnet assemblies 4 had external dimensions of 130 mm×2300 mm, and were disposed at a distance A of 270 mm.

On the other hand, as the process substrate, glass substrates having external dimensions of 1500 mm×1850 mm were used. As the sputtering conditions in each of the sputtering chambers 110a, 110b, the distance between the process substrate S and each of the targets 31a to 31h was set to 160 mm. The massflow controller was controlled so as to maintain the pressure inside the evacuated sputtering chamber 11 to 0.5 Pa, and Ar was introduced into the vacuum chamber 11. The temperature of the process substrate S was set to 120° C., the charged electric power was set to 30 kW, and the sputtering time was set to 50 seconds. In one 110a of the sputtering chambers, the center line of the direction of transportation of the parallelly disposed targets 31a to 31h was made to coincide with the center line which is at right angles to the direction of transportation of the mask plate 130, and was then moved to deviate to the upstream side (left side in FIG. 5) in the direction of transportation by A/4 and in the other sputtering chamber 110b, on the other hand, was moved to deviate by A/4 in the direction of transportation (left side in FIG. 5).

FIG. 6 is a graph showing the sheet resistance value (film quality distribution) of the process substrate along the direction in which the targets are disposed in parallel with one another, together with the film sheet resistance value when Al film was formed under the same conditions in both the sputtering chambers 110a, 110b. According to the above, when Al film was formed in each of the sputtering chambers, the portion which is high in the sheet resistance value and the portion in which the value is low were repeated, and the distribution of the sheet resistance value was ±10.7%. In the Example 2, on the other hand, by changing the position of the targets in each of the sputtering chambers, the distribution of the sheet resistance value was ±3.5%. It can thus be seen that the uneven undulations in the film thickness distribution and the film quality distribution on the surface of the process substrate were kept under control.

Figure 1:
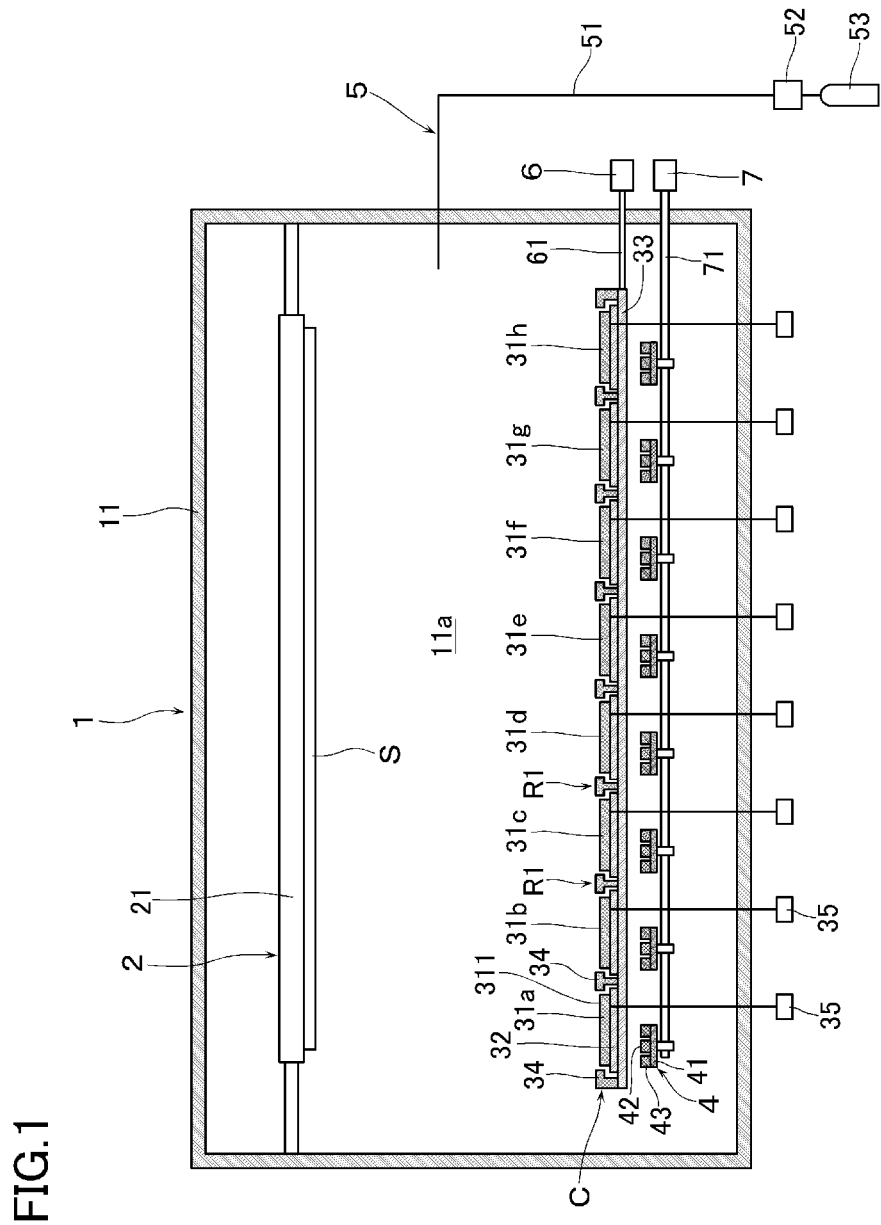
FIG. 1 is a schematic representation showing the sputtering apparatus of the invention.
Figure 2:
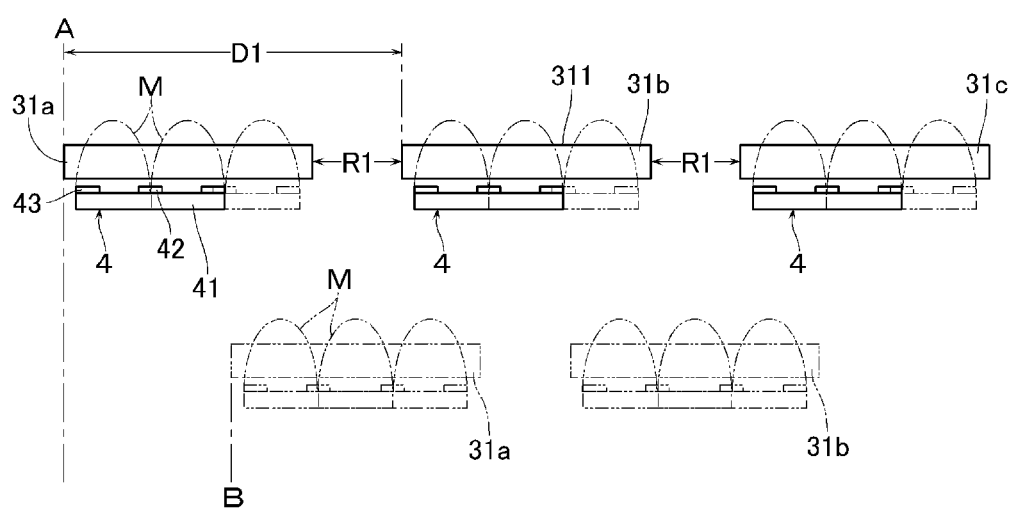
FIG. 2 is a diagram showing the reciprocal movement of the targets and the magnet assemblies.
Figure 3:
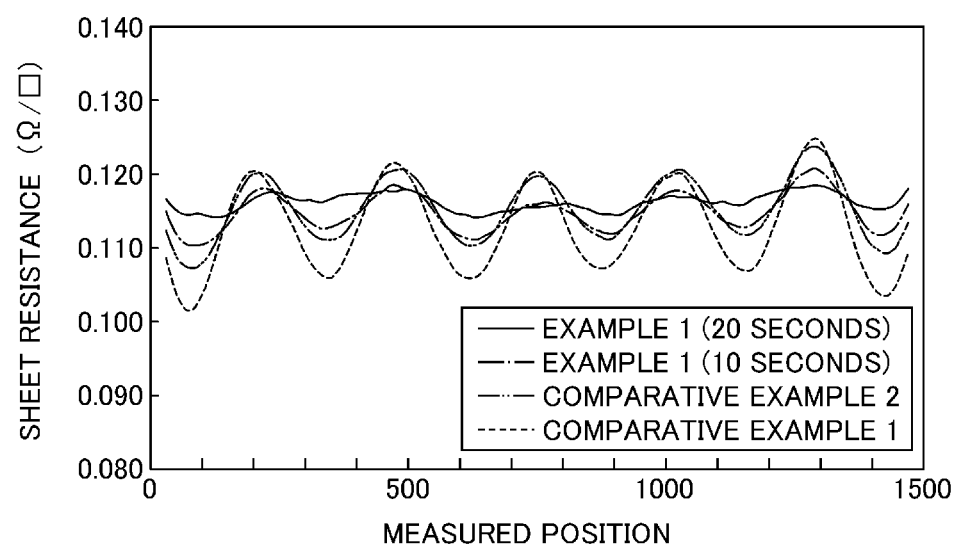
FIG. 3 is a graph showing the sheet resistance of a thin film obtained in Example 1 as represented together with the ones obtained in Comparative Example 1 and Comparative Example 2.
Figure 4:
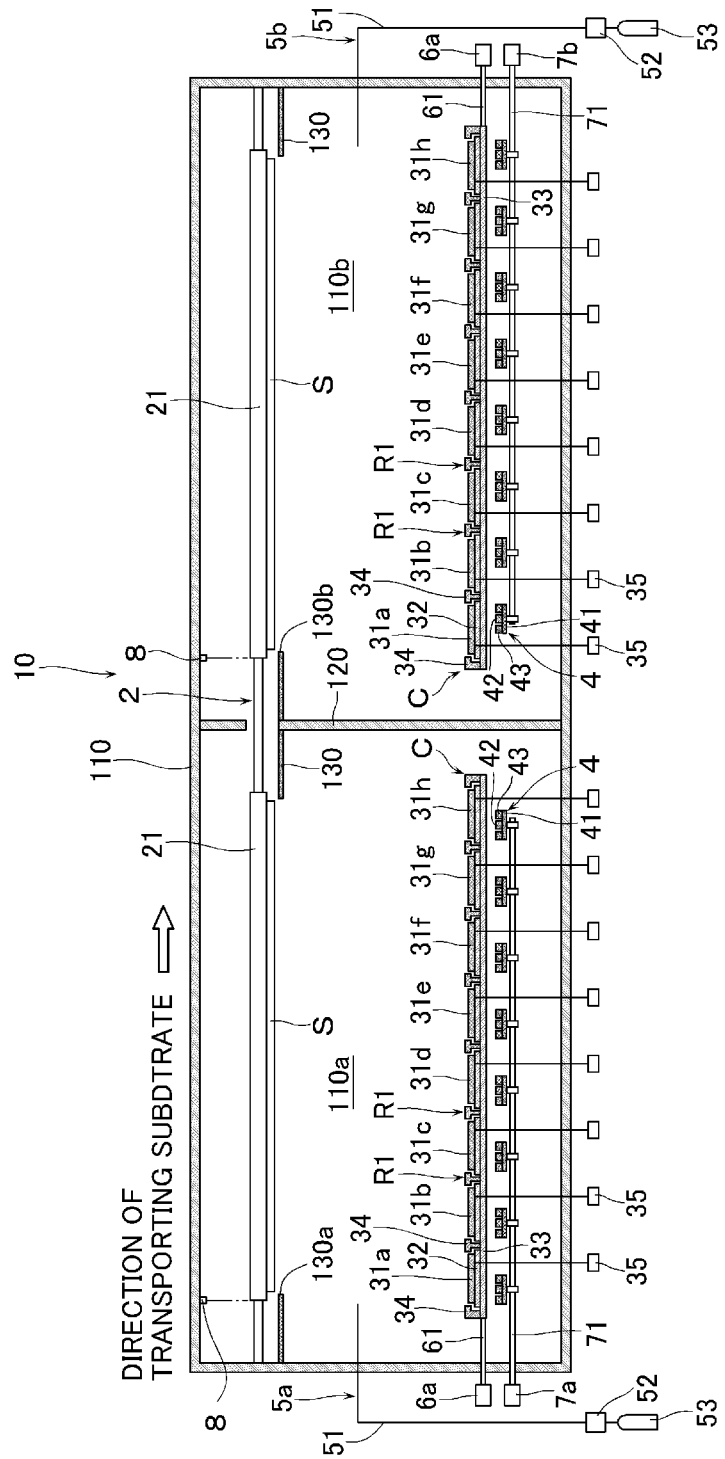
FIG. 4 is a schematic representation showing the sputtering apparatus relating to a modified example of the invention.
Figure 5:
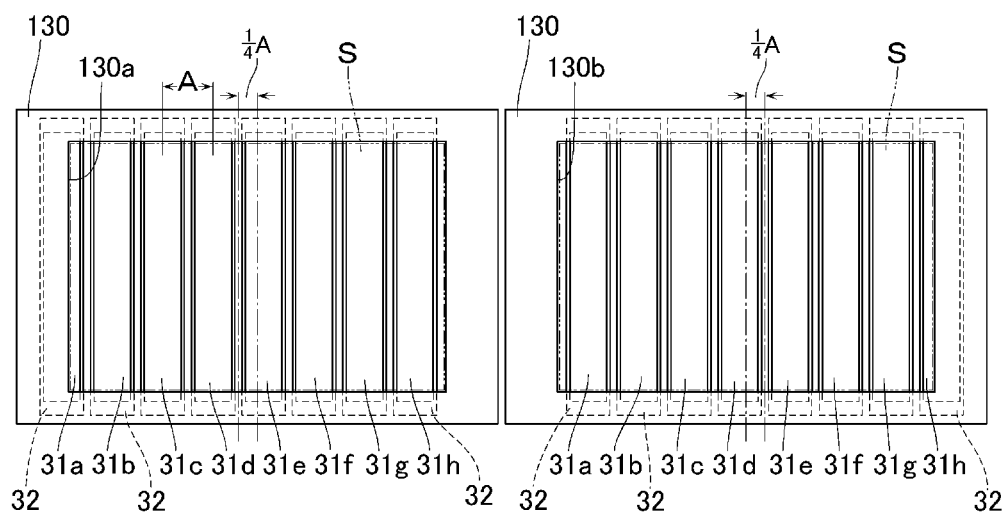
FIG. 5 is a schematic plan view showing the position of each target relative to the process substrate in each of the sputtering chambers.
Figure 6:
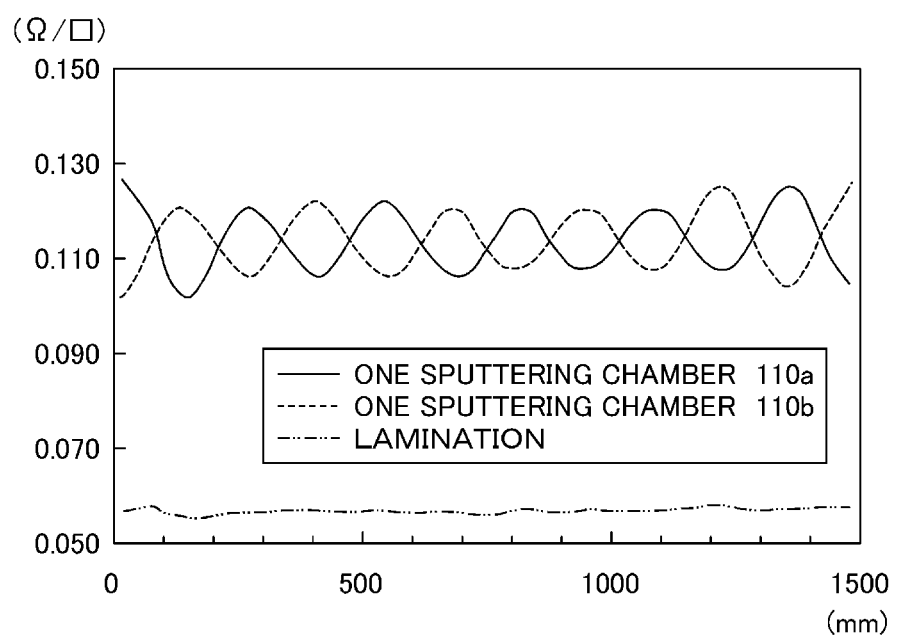
FIG. 6 is a graph showing the sheet resistance value of a thin film obtained in Example 2.

DESCRIPTION OF REFERENCE NUMERALS 1 sputtering apparatus
11a sputtering chamber
31a to 31h targets
35 sputtering power source
5 gas introducing means
6, 7 driving means
S process substrate

What is claimed is:
1. A method of forming a thin film in which electric power is charged to a plurality of targets disposed in a sputtering chamber in opposite positional relationship with a process substrate, the targets being disposed in parallel with, and at a predetermined distance to, one another, wherein each of the targets is reciprocated at a constant speed in parallel with the process substrate;

wherein each of magnet assemblies which respectively forms a tunnel-shaped magnetic flux in front of each of the targets is reciprocated at a constant speed in parallel with each of the targets; and wherein when each of the targets has reached a return point of the reciprocating movement, the reciprocating movement of each of the targets is stopped for a predetermined period of time, and wherein the charging of electric power to the targets is performed only while each of the targets is stopped in the reciprocating movement.

2. The method of forming a thin film according to claim 1, wherein, while the reciprocating movement of each of the targets is stopped for a predetermined period of time, the magnet assemblies are moved to make at least one reciprocating movement.

3. A method of forming a thin film in which a process substrate is transported, among at least a first and second sputtering chambers in which an equal number of targets are respectively disposed at an equal distance from, and in parallel with, one another, to a position lying opposite to each of the targets, and laminate an equal or different thin film on the surface of the process substrate by sputtering, wherein the position of each of the targets in the first chamber is deviated mutually and integrally in a direction of transporting the process substrate relative to the process substrate and the position of each of the targets in the second chamber is deviated mutually and integrally in a different direction from the direction of first chamber.

4. The method of forming a thin film according to claim 1, wherein AC voltage is charged to respective pairs of targets out of the parallelly disposed targets by alternately changing polarity at a predetermined frequency; wherein each of the targets is switched to an anode electrode and a cathode electrode, wherein plasma atmosphere is formed between the anode electrode and the cathode electrode by generating glow discharge, whereby each of the targets is sputtered.

5. An apparatus for forming a thin film comprising:
a sputtering chamber configured to receive a plurality of targets and a process substrate, the targets being in an opposite positional relationship with the process substrate at a predetermined distance to each other, the targets being disposed in parallel with one another;

magnet assemblies that respectively form magnetic fluxes in front of the targets;

a first driving means that reciprocates each of the targets at a constant speed in the direction in which each of the targets is disposed in parallel with one another;

a second driving means that reciprocates the magnet assemblies in parallel with the target;

a stopping means that stops the reciprocating movement of each of the targets for a predetermined period of time when the targets have reached a return point of the reciprocating movement; and a sputtering power source that enables electric charge to each of the targets only while each of the targets is stopped in the reciprocating movement.

6. The apparatus for forming a thin film according to claim 5, wherein the sputtering electric power source is an AC power source that charges voltage to respective pairs to be formed by the plurality of targets at a predetermined frequency by alternately changing polarity.

7. The method of forming a thin film according to claim 1, wherein, while the reciprocating movement of each of the targets is stopped for a predetermined period of time, the magnet assemblies are moved to make at least one reciprocating movement.

8. The method of forming a thin film according to claim 3, wherein AC voltage is charged to respective pairs of targets out of the parallelly disposed targets by alternately changing polarity at a predetermined frequency; wherein each of the targets is switched to an anode electrode and a cathode electrode, wherein plasma atmosphere is formed between the anode electrode and the cathode electrode by generating glow discharge, whereby each of the targets is sputtered.

9. The method of forming a thin film according to claim 1, wherein the predetermined period of time is set below 50% of the sputtering time.

10. The method of forming a thin film according to claim 1, wherein the predetermined period of time is set to the same period of time at each of the return points.

11. According to claim 3, wherein the position of each of the targets in the first and second sputtering chambers is deviated by $\lambda/4$ to a direction of transporting the process substrate relative to the process substrate.

* * * * *